United States Patent
Choi

(10) Patent No.: US 6,833,279 B2
(45) Date of Patent: Dec. 21, 2004

(54) METHOD OF FABRICATING AND REPAIRING CERAMIC COMPONENTS FOR SEMICONDUCTOR FABRICATION USING PLASMA SPRAY PROCESS

(75) Inventor: Jin-Sik Choi, Osan (KR)

(73) Assignee: Komico Co., Ltd., Kyungki-do (KR)

(*) Notice: Subject to any disclaimer, the term of this patent is extended or adjusted under 35 U.S.C. 154(b) by 35 days.

(21) Appl. No.: 10/309,325

(22) Filed: Dec. 4, 2002

(65) Prior Publication Data

US 2003/0129772 A1 Jul. 10, 2003

(30) Foreign Application Priority Data

Dec. 7, 2001 (KR) .................................. 10-2001-0077411

(51) Int. Cl.[7] .............................................. H01L 21/00
(52) U.S. Cl. ........................... 438/4; 438/763; 438/974
(58) Field of Search ......................... 438/4, 763, 778, 438/974

(56) References Cited

U.S. PATENT DOCUMENTS 4,412,377 A * 11/1983 Nagashima et al. ........ 438/122
5,900,102 A * 5/1999 Reeves ........................ 156/344
6,673,709 B2 * 1/2004 Jaslier et al. ............... 438/763

* cited by examiner

Primary Examiner—Chandra Chaudhari
(74) Attorney, Agent, or Firm—Rothwell, Figg, Ernst & Manbeck

(57) ABSTRACT

Provided is a method of fabricating and repairing ceramic components for semiconductor fabrication, through which erosion and polymer deposition occurring on ceramic components for semiconductor fabrication are decreased by modifying the dielectric surface of a component having an electrical insulation characteristic so that the ceramic components can be repaired after being used. The method includes activating a surface layer of a component, which is manufactured by sintering a ceramic, and depositing a dielectric coating layer on the surface layer of the ceramic component using a plasma spray process; when the dielectric coating layer is damaged as the ceramic component is used for semiconductor fabrication, removing the dielectric coating layer; and repairing the ceramic component by depositing a dielectric coating layer on the surface layer of the ceramic component from which the damaged dielectric coating layer has been removed.

2 Claims, 3 Drawing Sheets

METHOD OF FABRICATING AND REPAIRING CERAMIC COMPONENTS FOR SEMICONDUCTOR FABRICATION USING PLASMA SPRAY PROCESS

CROSS-REFERENCE TO RELATED APPLICATIONS

This application claims the priority of Korean Patent Application No. 2001-77411, filed Dec. 7, 2001, which is incorporated herein in its entirety by reference.

BACKGROUND OF THE INVENTION

1. Field of the Invention

The present invention relates to a method of fabricating and repairing ceramic components for semiconductor fabrication, and more particularly, to a method of fabricating and repairing ceramic components for semiconductor fabrication, through which erosion and polymer deposition occurring on ceramic components for semiconductor fabrication are decreased by modifying the dielectric surface of a component having an electrical insulation characteristic so that the ceramic components can be repaired after being used.

2. Description of the Related Art

Usually, plasma is used for etching and deposition during semiconductor fabrication. Here, most of components used for semiconductor fabrication have a dielectric surface, and particularly they are alumina components formed using a sintering process.

During semiconductor fabrication, components having a dielectric surface exposed to plasma sustain damage such as erosion due to a chemical attack by a radical or physical attack due to ion bombardment caused by floating potential of plasma according to plasma conditions. When components are damaged due to erosion, particles occur on a semiconductor wafer due to alien substances, which badly affect a yield of semiconductor fabrication. Accordingly, when the dielectric surface of components is badly damaged due to, for example, erosion, it is necessary to replace the damaged components with new components.

In addition, a polymer generated as a byproduct during semiconductor fabrication must be smoothly attached to and detached from components for semiconductor fabrication according to process conditions. However, since the surface characteristics of components depend on processes of manufacturing the components, it is difficult to modify the surface characteristics except roughness, so it is difficult to control a state of surface of components to be suitable to semiconductor fabrication processes. In this case, components having new characteristics cannot be manufactured without changing the materials and manufacturing methods of all of components.

FIG. 1 is a flowchart of a conventional method of manufacturing ceramic components for semiconductor fabrication and processing them after using them. As shown in FIG. 1, a ceramic is sintered to manufacture a component for semiconductor fabrication in step S10. Next, the manufactured component is used in step S20. When the component is used, a surface layer of the component is chemically and/or physically etched due to plasma and cleaning in step S30. Then, the component is discarded.

Such conventional ceramic components for semiconductor fabrication are manufactured using a sintering process, so it is difficult to control their surface characteristics except roughness. In addition, when the conventional ceramic components are used, the surface of the ceramic components are chemically etched due to a radical and ion bombardment occurring in a reactor due to plasma, so the surface of the ceramic components erode and corrode. Accordingly, semiconductor fabrication progresses with the ceramic components having a different surface state than an initial surface state. Moreover, as the surface of a ceramic component is continuously etched during reaction, the surface of the ceramic component changes and needs to be replaced with new expensive ceramic component.

SUMMARY OF THE INVENTION

The present invention provides a method of fabricating and repairing ceramic components for semiconductor fabrication, through which erosion and polymer deposition occurring on ceramic components for semiconductor fabrication are decreased by modifying the dielectric surface of a component having an electrical insulation characteristic so that the ceramic components can be repaired after being used.

In one aspect of the present invention, there is provided a method of manufacturing and repairing a ceramic component for semiconductor fabrication. The method includes activating a surface layer of a component, which is manufactured by sintering a ceramic, and depositing a dielectric coating layer on the surface layer of the ceramic component using a plasma spray process; when the dielectric coating layer is damaged as the ceramic component is used for semiconductor fabrication, removing the dielectric coating layer; and repairing the ceramic component by depositing a dielectric coating layer on the surface layer of the ceramic component from which the damaged dielectric coating layer has been removed.

The depositing the dielectric coating layer includes depositing one material selected from the group consisting of alumina, zirconia, yttria, and YAG on the surface layer of the ceramic component. The repairing the ceramic component includes depositing one material selected from the group consisting of alumina, zirconia, yttria, and YAG on the surface layer of the ceramic component.

According to the present invention, the surface of a component for semiconductor fabrication is coated with alumina powder, yttria powder, YAG powder, or zirconia powder having excellent plasma and chemical resistance to a proper thickness to each semiconductor fabrication process, and the surface roughness and porosity of the coating can be controlled. Therefore, the present invention allows the surface of the component to be in a proper state to each semiconductor fabrication process, thereby reducing contamination due to particles and polymers. In addition, when the surface of the component is damaged, the expensive component for semiconductor fabrication can be repaired and reused by recoating the surface of the component, instead of discarding the component, thereby reducing cost of semiconductor fabrication.

BRIEF DESCRIPTION OF THE DRAWINGS

The above features and advantages of the present invention will become more apparent by describing in detail a preferred embodiment thereof with reference to the attached drawings in which.

DETAILED DESCRIPTION OF THE INVENTION

Hereinafter, a preferred embodiment of the present invention will be described in detail with reference to the attached drawings.

Figure 1:
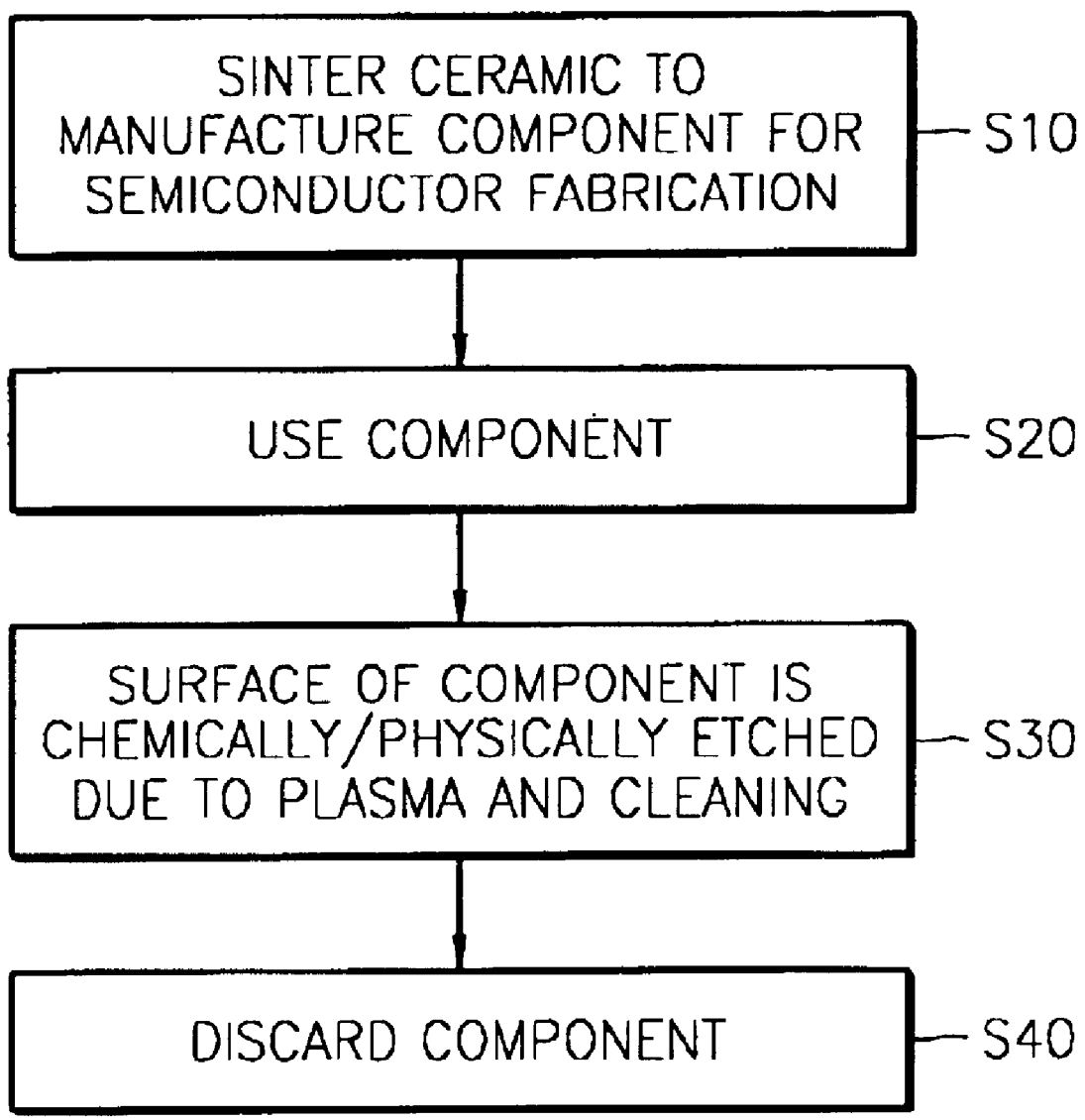
FIG. 1 is a flowchart of a conventional method of manufacturing ceramic components for semiconductor fabrication and processing them after using them.
Figure 2:
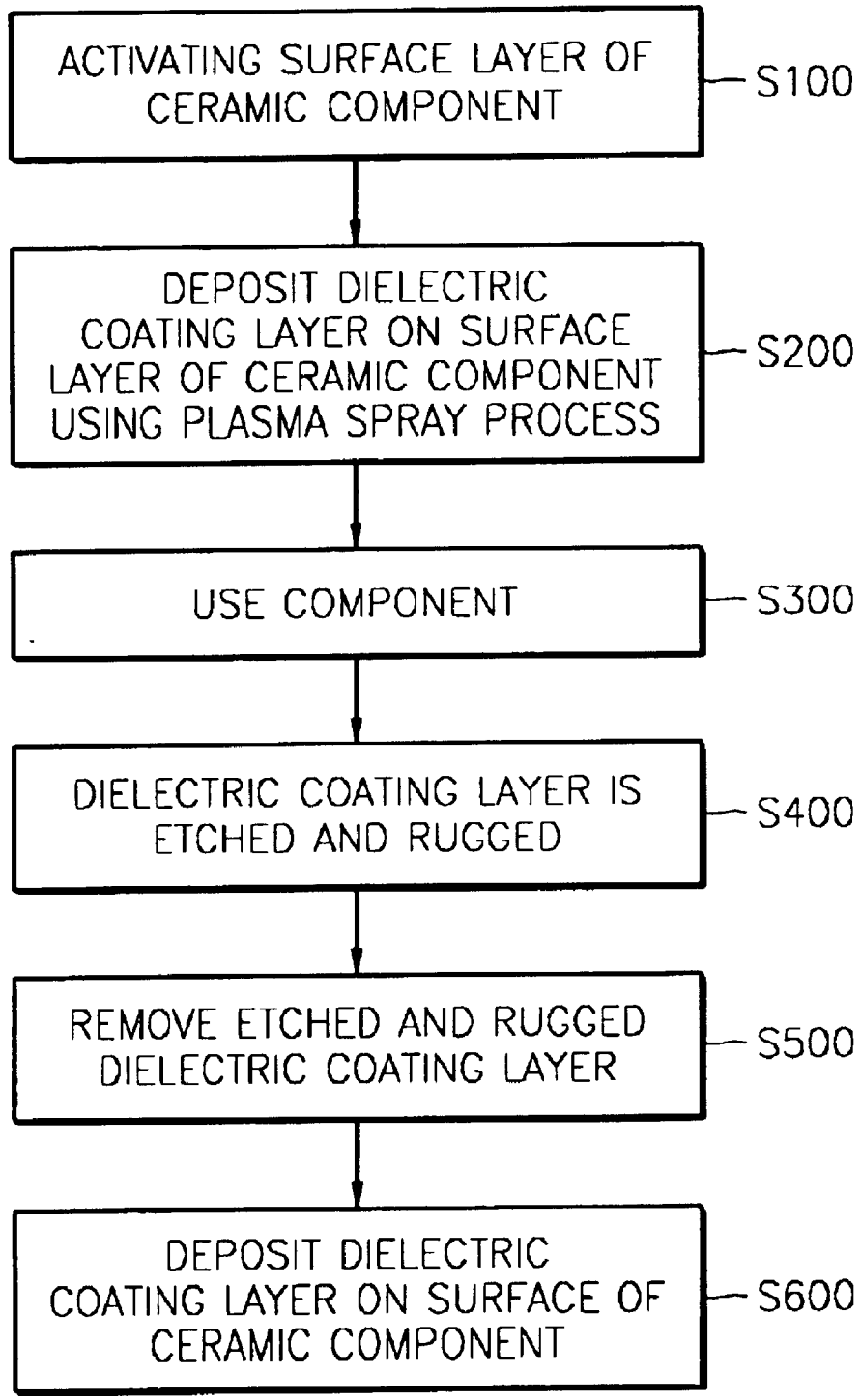
FIG. 2 is a flowchart of a method of manufacturing and repairing ceramic components for semiconductor fabrication using a plasma spray process according to an embodiment of the present invention.

FIG. 2 is a flowchart of a method of manufacturing and repairing a ceramic component for semiconductor fabrication using a plasma spray process according to an embodiment of the present invention. As shown in FIG. 2, the method includes activating a surface layer of a component for semiconductor fabrication, for example, an alumina component, which is manufactured by sintering a ceramic, and depositing a dielectric coating layer on the alumina surface layer using a plasma spray method in step S100 and S200; when the dielectric coating layer is etched and rugged as the ceramic component is used, removing the etched and rugged the dielectric coating layer in steps S300 through S500; and recoating the surface layer of the alumina component with a material having chemically and physically excellent characteristics to repair the ceramic component in step S600.

More specifically, in the method of manufacturing and repairing a ceramic component for semiconductor fabrication using a plasma spray process according to an embodiment of the present invention, a surface layer of a component for semiconductor fabrication, which is manufactured by sintering a ceramic, is activated in step S100.

Next, a dielectric coating layer is formed by depositing a material, which has chemically and physically excellent characteristics and is suitable for semiconductor fabrication processes, on the activated surface layer of the alumina component using a plasma spray process in step 200. Here, the dielectric coating layer can be formed by coating the surface of the ceramic component with alumina, zirconia, yttria, or YAG. By forming the dielectric coating layer using alumina, zirconia, yttria, or YAG, cheaper and more reliable process conditions can be secured compare to a case of processing an entire ceramic component with yttria and YAG.

When the plasma spray process is used, the density and porosity of a coating layer can be changed according to processing conditions, so a polymer generated as a byproduct during semiconductor fabrication can be removed from a reactor, and a ceramic material, density, and porosity suitable to the characteristics of each semiconductor fabrication process can be provided. In other words, the present invention allows only the surface of a component to be controlled regardless of a base material of the component. The base material may be a ceramic, metal, plastic, or any other material.

Figure 3A:
FIG. 3A shows the surface of a ceramic component manufactured for semiconductor fabrication according to the embodiment of the present invention.
Figure 3B:
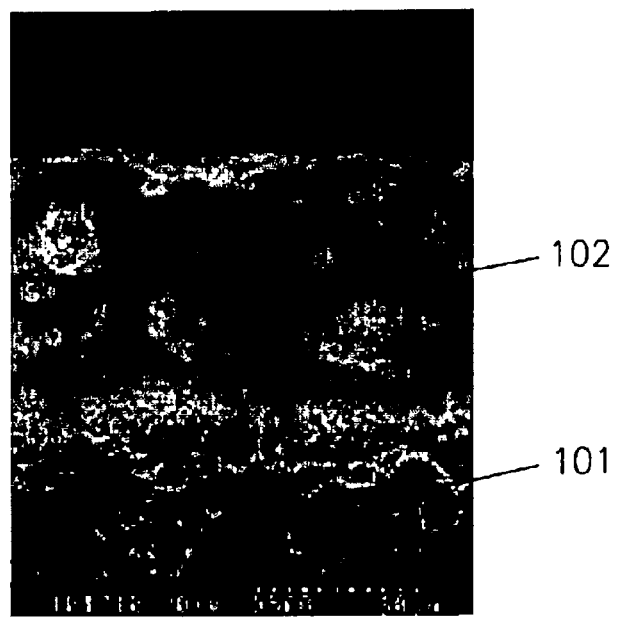
FIG. 3B shows a cross-section of a ceramic component manufactured for semiconductor fabrication according to the embodiment of the present invention.

FIG. 3A shows the surface of a ceramic component manufactured for semiconductor fabrication according to the embodiment of the present invention, and FIG. 3B shows a cross-section of a ceramic component manufactured for semiconductor fabrication according to the embodiment of the present invention. In FIG. 3B, reference numeral 101 denotes a surface layer of an alumina substrate, and reference numeral 102 denotes an yttrium oxide coating layer.

Thereafter, the component with the dielectric coating layer is used for semiconductor fabrication in step S300. As the component is used, the dielectric coating layer is etched and rugged in step S400. Conventionally, the component is discarded and replace with a new component, but according to the present invention, the component can be repaired and reused.

More specifically, the etched and rugged dielectric coating layer is removed using an etching process in step S500. Next, the surface layer of the alumina substrate is recoated with a material, which has chemically and physically excellent characteristics and is suitable for semiconductor fabrication processes, so that the damaged component can be repaired.

The damaged component for semiconductor fabrication can be easily repaired by coating the surface layer of the alumina substrate with alumina, zirconia, yttria, or YAG, which has chemically and physically excellent characteristics.

The present invention as described above can provide material and surface conditions suitable for the characteristics of each semiconductor fabrication process for a component for semiconductor fabrication, thereby securing reliability of semiconductor fabrication. In addition, in the course of or after use, a ceramic component for semiconductor fabrication can be repaired and reused, so cost of semiconductor fabrication can be reduced.

What is claimed is:

1. A method of manufacturing and repairing a ceramic component for semiconductor fabrication, the method comprising:

activating a surface layer of a ceramic component, which is manufactured by sintering a ceramic, and depositing a dielectric coating layer on the surface layer of the ceramic component using a plasma spray process, wherein the step of depositing the dielectric coating layer on the surface layer of the ceramic component comprises depositing one material selected from the group consisting of alumina, zirconia, yttria, and YAG on the surface layer of the ceramic component;

when the dielectric coating layer is damaged as the ceramic component is used for semiconductor fabrication, removing the dielectric coating layer; and repairing the ceramic component by depositing a dielectric coating layer on the surface layer of the ceramic component from which the damaged dielectric coating layer has been removed.

2. The method of claim 1, wherein the repairing the ceramic component comprises depositing one material selected from the group consisting of alumina, zirconia, yttria, and YAG on the surface layer of the ceramic component.

* * * * *